United States Patent
Gupta

(10) Patent No.: US 11,418,204 B2
(45) Date of Patent: Aug. 16, 2022

(54) PHASE LOCK LOOP (PLL) WITH OPERATING PARAMETER CALIBRATION CIRCUIT AND METHOD

(71) Applicant: STMicroelectronics International N.V., Geneva (CH)

(72) Inventor: Ankit Gupta, Delhi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/519,122

(22) Filed: Nov. 4, 2021

(65) Prior Publication Data

US 2022/0200607 A1 Jun. 23, 2022

Related U.S. Application Data

(60) Provisional application No. 63/128,968, filed on Dec. 22, 2020.

(51) Int. Cl.
*H03L 7/099* (2006.01)
*H03L 7/093* (2006.01)
*H03L 7/089* (2006.01)

(52) U.S. Cl.
CPC .......... *H03L 7/0992* (2013.01); *H03L 7/0898* (2013.01); *H03L 7/093* (2013.01)

(58) Field of Classification Search
CPC ...... H03L 7/0992; H03L 7/0898; H03L 7/093
See application file for complete search history.

(56) References Cited

U.S. PATENT DOCUMENTS

| 6,262,634 B1* | 7/2001 | Flanagan | H03L 7/081 331/25 |
| 6,834,183 B2 | 12/2004 | Black | |
| 7,015,738 B1* | 3/2006 | Cao | H03C 3/0933 331/10 |
| 7,148,760 B2 | 12/2006 | Vaananen | |
| 7,391,839 B2* | 6/2008 | Thompson | H03L 7/16 375/376 |
| 7,492,228 B2* | 2/2009 | Strange | H03B 5/1228 331/34 |
| 7,612,617 B2 | 11/2009 | Pullela et al. | |

(Continued)

OTHER PUBLICATIONS

Akamine, Yukinori, et al: "ΔΣ PLL Transmitter With a Loop-Bandwidth Calibration System," IEEE Journal of Solid-State Circuits, vol. 43, No. 2, Feb. 2008, pp. 497-506.

*Primary Examiner* — Adam D Houston
(74) *Attorney, Agent, or Firm* — Crowe & Dunlevy

(57) ABSTRACT

A calibration scheme is used to control PLL bandwidth and contain its spread. In open loop, the VCO control voltage is swept over a range of values and VCO output frequency is measured at each control voltage level. The gain KVCO is determined for each measured output frequency and a corresponding current magnitude for the variable magnitude charge pump is calculated from a ratio of a constant to the gain KVCO and correlated in a look-up table to the measured output frequency. Once calibration is completed, the PLL loop is closed and a calculated current magnitude is fetched from the look-up table based on a desired output frequency for the PLL circuit. The variable magnitude charge pump circuit is then controlled to generate a charge pump current with a magnitude corresponding to the fetched charge pump current magnitude.

27 Claims, 4 Drawing Sheets

(56) References Cited

U.S. PATENT DOCUMENTS

| | | | |
|---|---|---|---|
| 8,554,156 B2 | 10/2013 | Tadjpour | |
| 8,860,482 B1* | 10/2014 | Liu | H03L 7/099 327/148 |
| 8,872,556 B1* | 10/2014 | Chen | H03L 7/103 327/156 |
| 9,306,730 B1* | 4/2016 | Shu | H03L 7/081 |
| 10,340,927 B1* | 7/2019 | Gambhir | H03L 7/1075 |
| 10,389,368 B1* | 8/2019 | Wang | H03L 7/089 |
| 10,862,427 B1* | 12/2020 | Chan | H03C 3/0966 |
| 11,038,521 B1* | 6/2021 | Rafi | H03M 7/3024 |
| 11,184,013 B1* | 11/2021 | Grimaldi | H03C 3/095 |
| 2004/0183602 A1* | 9/2004 | Maunuksela | H03L 7/093 331/17 |
| 2005/0073369 A1* | 4/2005 | Balboni | H03C 3/0941 331/16 |
| 2006/0139105 A1* | 6/2006 | Maxim | H03L 7/0898 331/16 |
| 2009/0108891 A1* | 4/2009 | Sander | H03L 7/1075 327/156 |
| 2009/0189699 A1* | 7/2009 | Darabi | H03L 7/099 331/16 |
| 2010/0264993 A1* | 10/2010 | Wang | H03L 7/093 331/1 A |
| 2012/0043999 A1* | 2/2012 | Quevy | H03L 7/18 327/147 |
| 2013/0076450 A1* | 3/2013 | Rao | H03L 7/0896 331/34 |
| 2013/0222067 A1* | 8/2013 | Yin | H03L 7/099 331/25 |
| 2014/0015578 A1* | 1/2014 | Gebre-Selassie | H03L 7/08 327/157 |
| 2014/0049304 A1* | 2/2014 | Houdebine | H03L 7/093 327/551 |
| 2014/0266342 A1* | 9/2014 | Arai | H03L 7/104 327/156 |
| 2016/0065223 A1* | 3/2016 | Galton | H03L 7/197 327/159 |
| 2018/0198597 A1* | 7/2018 | Huang | H03L 7/0891 |
| 2019/0028109 A1* | 1/2019 | Abcarius | H03L 7/0893 |
| 2019/0379281 A1* | 12/2019 | Heschl | H02M 3/07 |
| 2020/0028662 A1* | 1/2020 | Brown | H03L 7/18 |
| 2020/0191660 A1* | 6/2020 | Choi | G11C 7/04 |
| 2020/0389175 A1* | 12/2020 | Gupta | H03L 7/0891 |
| 2021/0344348 A1* | 11/2021 | Bhaumik | H03L 7/1075 |

* cited by examiner

PHASE LOCK LOOP (PLL) WITH OPERATING PARAMETER CALIBRATION CIRCUIT AND METHOD

CROSS-REFERENCE TO RELATED APPLICATIONS

This application claims priority to United States Provisional Application for Patent No. 63/128,968, filed Dec. 22, 2020, the disclosure of which is incorporated by reference.

TECHNICAL FIELD

The present invention generally relates to a phase lock loop (PLL) circuit and, in particular, to the calibration of operating parameters for the PLL circuit.

BACKGROUND

Reference is made to FIG. 1 showing a block diagram of a phase lock loop (PLL) circuit 10. A phase-frequency detector (PFD) circuit 12 has a first input that receives a reference clock signal CLKref(t) and a second input that receives a feedback clock signal CLKfb(t). The PFD circuit 12 measures the difference between like edges (i.e., rising edges or falling edges) of the reference clock signal CLKref(t) and the feedback clock signal CLKfb(t). In the case where the PFD circuit 12 detects that the like edges of the reference clock signal CLKref(t) and the feedback clock signal CLKfb(t) are aligned, an up signal U(t) is pulsed and a down signal D(t) is pulsed (the two pulses being synchronized and having a same duration of time). If the PFD circuit 12 detects a situation where the edge of the reference clock signal CLKref(t) leads the like edge of the feedback clock signal CLKfb(t), an up signal U(t) is pulsed for a first duration of time and the down signal D(t) is pulsed for a second duration of time (less than the first duration), where the length of the first duration is dependent on the error in phase between the like edges. Conversely, if the edge of the feedback clock signal CLKfb(t) leads the like edge of the reference clock signal CLKref(t), the PFD circuit 12 pulses the down signal D(t) for a third duration of time and pulses the up signal U(t) for a fourth duration of time (less than the third duration), where the length of the third duration is dependent on the error in phase between the like edges.

FIG. 2 shows a block diagram of an embodiment of the PFD circuit 12. The PFD circuit 12 includes a first D-type flip flop (FF) circuit 14 having a data (D) input that receives a logic high voltage (Vdd) and a clock (CLK) input that receives the reference clock signal CLKref(t). The output (Q) of the FF circuit 14 generates the up signal U(t). The PFD circuit 12 further includes a second D-type flip flop (FF) circuit 16 having a data (D) input that receives a logic high voltage (Vdd) and a clock (CLK) input that receives the feedback clock signal CLKfb(t). The output (Q) of the FF circuit 16 generates the down signal D(t). A logic AND gate 18 has a first input that receives the up signal U(t) and a second input that receives the down signal D(t). The gate 18 logically ANDs those signals to generate a reset signal that is applied to the reset inputs of the first and second FF circuits 14 and 16.

FIG. 2 further shows the waveforms for the up signal U(t) and down signal D(t) for the operational cases where: a) like edges of the reference clock signal CLKref(t) and the feedback clock signal CLKfb(t) are aligned; b) the edge of the reference clock signal CLKref(t) leads the like edge of the feedback clock signal CLKfb(t); and c) the edge of the feedback clock signal CLKfb(t) leads the like edge of the reference clock signal CLKref(t). The smaller pulse width for the up signal U(t) and down signal D(t) in cases a), b) and c) is controlled by the time delay (td) for operation of the AND gate 18 to cause the first and second FF circuits 14 and 16 to reset. This is the minimum pulse width for the up signal U(t) and down signal D(t). The longer pulse width for the up signal U(t) and the down signal D(t) in cases b) and c), respectively, is controlled as a function of the sum of the minimum pulse width (td) plus the difference in time (i.e., the phase difference—pd) between the like edges of the reference clock signal CLKref(t) and the feedback clock signal CLKfb(t).

With reference once again to FIG. 1, a charge pump (CP) circuit 20 generates an output current Icp(t) in response to the durations (i.e., widths) of the pulses of the up signal U(t) and the down signal D(t). The CP circuit 20 includes a current source (path) circuit 20a that operates in response to the up signal U(t) to provide a sourcing current contribution having a fixed magnitude (M) to the charge pump output current Icp(t) with a duration corresponding to the duration of the up signal U(t). The CP circuit 20 further includes a current sink (path) circuit 20b that operates in response to the down signal D(t) to provide a sinking current contribution having the same fixed magnitude (M) to the charge pump output current Icp(t) with a duration corresponding to the duration of the down signal D(t). The output current Icp(t) is the difference between the sourcing current contribution and the sinking current contribution. When the up and down signals have identical pulses, as in case a) noted above, the output current Icp(t) is zero because the sourcing current contribution and the sinking current contribution due the pulses of the up signal U(t) and the down signal D(t) are offset. In the case where the up signal U(t) pulse duration is longer than the down signal D(t) pulse duration, as in case b) noted above, the output current Icp(t) comprises a momentary sourcing of current (current pulse 21a) with said fixed magnitude (M) and for a duration of the difference in the widths of the pulses of the up signal U(t) and the down signal D(t). Conversely, in the case where the down signal D(t) pulse duration is longer than the up signal U(t) pulse duration, as in the case c) noted above, the output current Icp(t) comprises a momentary sinking of current (current pulse 21b) with said fixed magnitude (M) and for a duration of the difference in the widths of the pulses of the up signal U(t) and the down signal D(t).

A loop filter (LF) circuit 22 filters the output current Icp(t) from the charge pump circuit 20 to generate a control voltage Vctrl(t). In an embodiment, the LF circuit 22 is implemented as an analog integration circuit, and so the control voltage Vctrl(t) is generated by integrating the sourcing and sinking currents. Thus, the control voltage Vctrl(t) will incrementally increase in response to each current pulse 21a of the output charge pump current Icp(t) and incrementally decrease in response to each current pulse 21b of the output charge pump current Icp(t).

A voltage controlled oscillator (VCO) circuit 30 generates an oscillating output signal Vout(t) having a frequency that is controlled by the level of the control voltage Vctrl(t). An increase in the control voltage Vctrl(t) level due to current pulse 21a for the output charge pump current Icp(t) causes a corresponding increase in the frequency of the oscillating output signal Vout(t). Conversely, a decrease in the control voltage Vctrl(t) level due to current pulse 21b for the output charge pump current Icp(t) causes a corresponding decrease in the frequency of the oscillating output signal Vout(t).

A fixed divider and level shifting circuit 32 frequency divides the oscillating output signal Vout(t) by a fixed divisor value and level shifts the resulting signal to desired voltage levels. As an example, the fixed division performed by the circuit 32 may divide the frequency of the oscillating output signal Vout(t) by a desired integer (for example, divide by 4). It will be understood that in some embodiments the divisor will equal 1, and thus no frequency division is performed. The circuit 32 in such a case then performs only a level shifting function. Additionally, it will be understood that in instances where level shifting of the oscillating output signal Vout(t) is not required, the level shifting function of circuit 32 may be omitted. In an embodiment, the level shifting and/or fixed division functions of the circuit 32 may be integrated into the VCO circuit 30.

A programmable divider circuit 34 frequency divides the (divided and level shifted, if desired or necessary) oscillating output signal Vout(t) to generate the feedback clock signal CLKfb(t). The programmable divider circuit 34 implements a programmable division ratio between the frequency of the oscillating output signal Vout(t) and the frequency of the feedback clock signal CLKfb(t). That programmable division ratio is set by divisor control signals which specify an integer component INTdiv and a fractional component FRACdiv for the divisor.

The PLL loop small signal forward path gain for the PLL circuit 10 is proportional to the charge pump current Icp(t), the gain KVCO of the VCO circuit 30 and the resistance R of the loop filter circuit 22. Conventionally, Icp*R is kept constant by design. However, the spread of the gain KVCO is fully reflected in the bandwidth of the PLL circuit 10. It is recognized that the gain KVCO has a high dependence on process, temperature and frequency variation. For example, the gain KVCO changes by two times to as high as eight times with process, temperature and frequency variation. The design of the PLL circuit 10 can reduce KVCO variation, but this will place tight constraints on the VCO circuit 30 in terms of achievable phase noise. In order to tolerate a larger KVCO variation, the PLL circuit 10 can utilize a larger loop stabilization capacitance (with a consequent increase in occupied circuit area) and utilize more power in order to keep jitter within specification. Larger circuit area and higher power dissipation are not, however, satisfactory in many circuit applications.

It is accordingly clear that some compensation for VCO gain KVCO variation is a requirement for PLL circuit operation.

SUMMARY

In an embodiment, a circuit is presented for calibrating a variable magnitude charge pump current of a charge pump circuit in a phase lock loop (PLL) circuit that includes a voltage controlled oscillator (VCO) circuit. The circuit comprises: a voltage generator circuit configured, with the PLL circuit in open loop, to apply a sweeping control voltage to the VCO circuit in a plurality of discrete steps with a voltage difference between steps; a frequency measurement circuit configured to measure a frequency of a signal output from the VCO circuit at each step; and a processing circuit. The processing circuit operates to: determine a gain of the VCO circuit for each measured frequency as a function of a difference in measured frequency between steps divided by said voltage difference between steps; calculate a calibrated magnitude for the variable magnitude charge pump current correlated to each measured frequency as a function of a constant divided by the determined gain for that measured frequency; identify one of the measured frequencies which is closest to a desired frequency of the signal output from the VCO circuit; and control the variable magnitude charge pump circuit in the PLL circuit to generate the charge pump current with a magnitude equal to the calibrated magnitude for the nominal charge pump current that is correlated to the identified one of the measured frequencies.

In an embodiment, a phase lock loop (PLL) circuit comprises: a phase-frequency detector configured to compare a reference signal to a feedback signal and generate an up control signal and down control signal in response to the comparison; a variable magnitude charge pump circuit configured to generate a charge pump output current in response to the up control signal and down control signal, said charge pump output current have a magnitude set in response to a digital control signal; a loop filter configured to receive the charge pump output current and generate a control voltage; a voltage controlled oscillator (VCO) circuit configured to generate an oscillator output signal in response to the control voltage; a loop divider circuit configured to generate the feedback signal from the oscillator output signal with a frequency division set by a divisor control signal; and a processing circuit including a look-up table that correlates a plurality of measured frequencies for the oscillator output signal to a corresponding plurality of calibrated magnitudes for the charge pump output current. The processing circuit is configured to: respond to the divisor control signal to determine a desired frequency of the signal output from the VCO circuit; identify one of the measured frequencies in the look-up table which is closest to the desired frequency; and generate the digital control signal to set the magnitude of the charge pump output current to equal the calibrated magnitude that is correlated to the identified one of the measured frequencies.

In an embodiment, a method is presented for calibrating a charge pump current of a variable magnitude charge pump circuit in a phase lock loop (PLL) circuit that includes a voltage controlled oscillator (VCO) circuit. The method comprises: placing the PLL circuit in open loop, and while in open loop: applying a sweeping control voltage to the VCO circuit in a plurality of discrete steps with a voltage difference between steps; measuring a frequency of a signal output from the VCO circuit at each step; determining a gain of the VCO circuit for each measured frequency as a function of a difference in measured frequency between steps divided by said voltage difference between steps; and calculating a calibrated magnitude for the charge pump current correlated to each measured frequency as a function of a constant divided by the determined gain for that measured frequency; identifying one of the measured frequencies which is closest to a desired frequency of the signal output from the VCO circuit; controlling the variable magnitude charge pump circuit in the PLL circuit to generate the charge pump current with a magnitude equal to the calibrated magnitude that is correlated to the identified one of the measured frequencies; and placing the PLL circuit in closed loop.

BRIEF DESCRIPTION OF THE DRAWINGS

For a better understanding of the embodiments, reference will now be made by way of example only to the accompanying figures in which.

DETAILED DESCRIPTION

Figure 3:
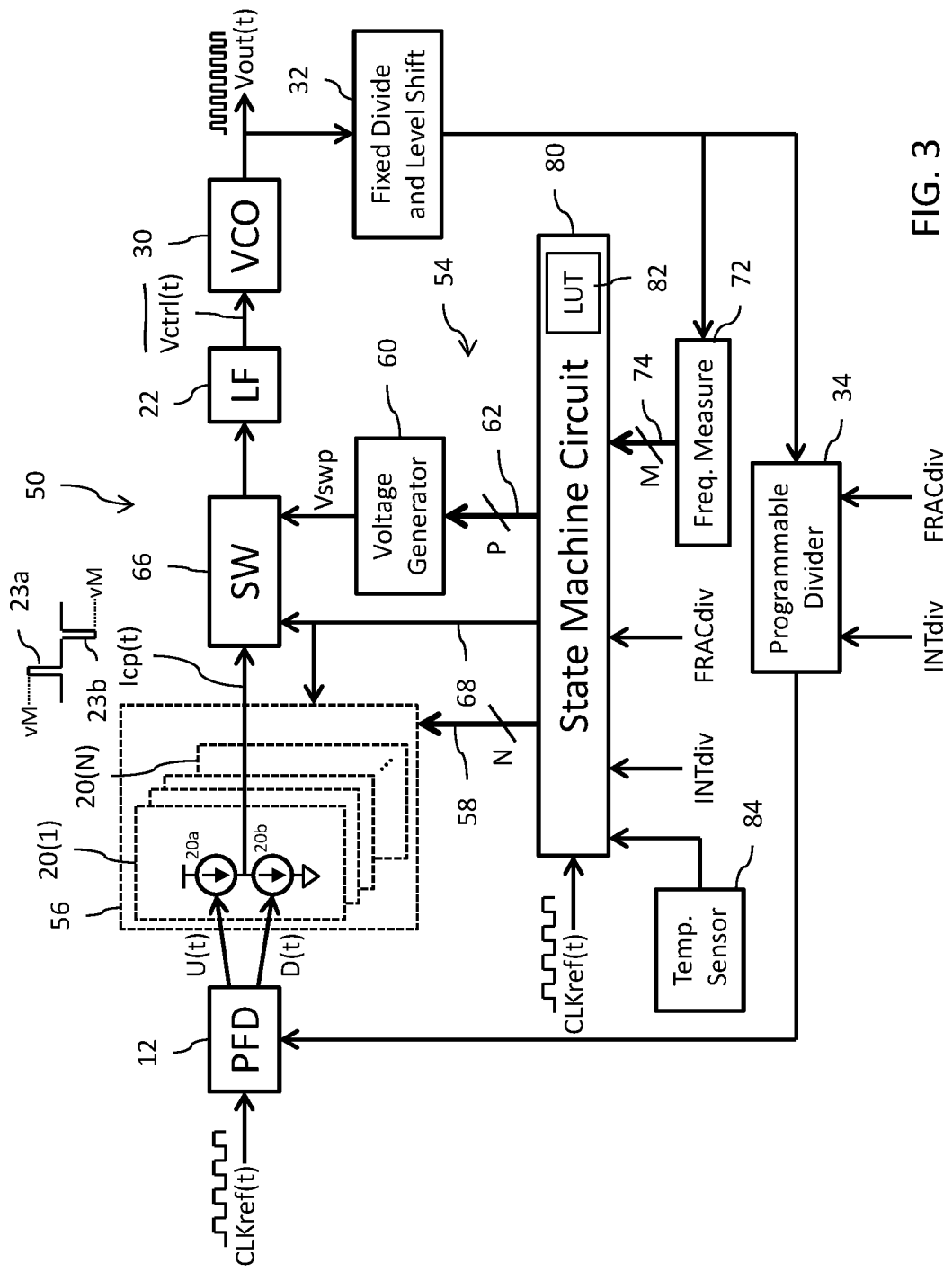
FIG. 3 is a block diagram of a PLL circuit that implements parameter calibration.

FIG. 3 shows a block diagram of a phase lock loop (PLL) circuit 50 that implements a parameter calibration. Like reference numbers in FIGS. 1 and 3 refer to same or similar components, circuits, parts, signals, etc., and a repeated discussion thereof is omitted here for the sake of brevity. See, discussion above.

Figure 1:
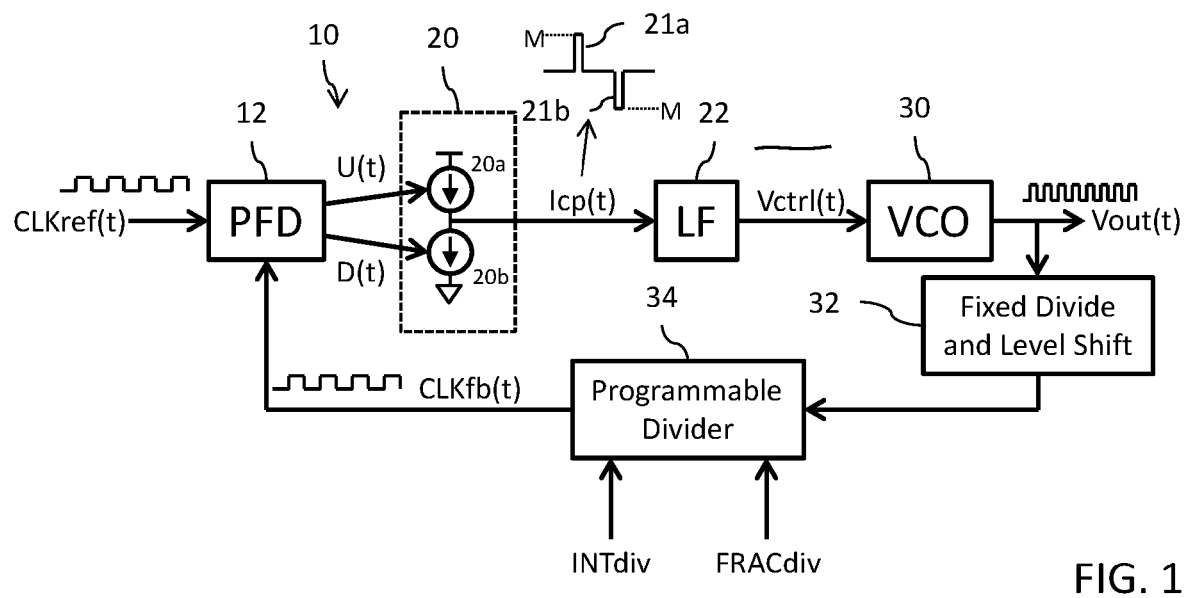
FIG. 1 is a block diagram of a phase lock loop (PLL) circuit.
Figure 2:
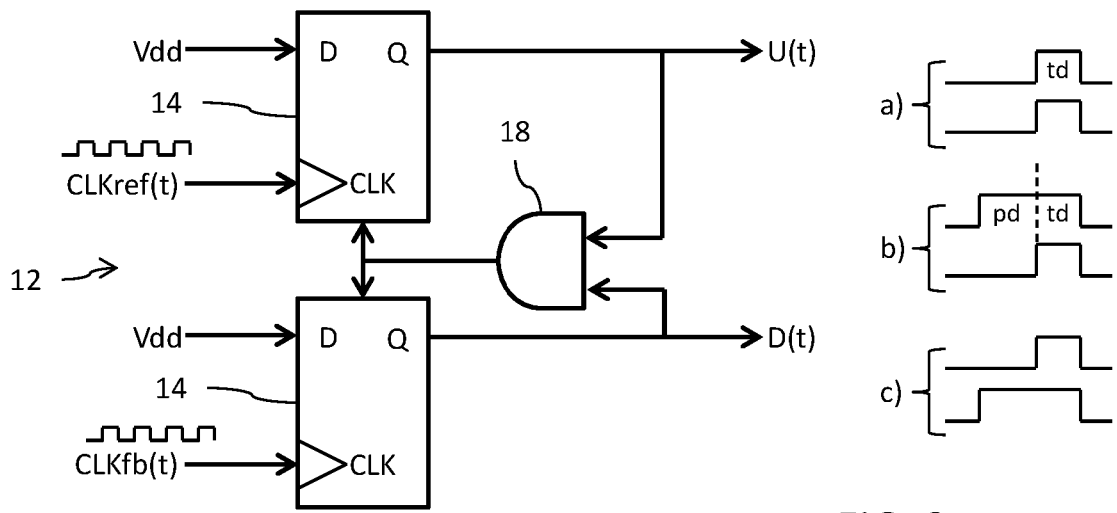
FIG. 2 is a block diagram of a phase-frequency detector circuit used in the PLL circuit of FIG. 1.

The PLL circuit 50 differs from the circuit 10 of FIG. 1 in one way in that it utilizes a variable magnitude charge pump circuit 56 (also referred to by those skilled in the art as current digital-to-analog (DAC) circuit). The charge pump circuit 56 operates in response to assertion of the up signal U(t) to provide a sourcing current contribution to the charge pump output current Icp(t). The charge pump circuit 56 further operates in response to assertion of the down signal D(t) to provide a sinking current contribution to the charge pump output current Icp(t). However, unlike the circuit 20 used in FIG. 1 where the magnitude of the current pulses 21a and 21b is fixed, the circuit 56 generates the sourcing current pulse 23a and sinking current pulse 23b for the charge pump output current Icp(t) to each have a variable magnitude vM that is set by the digital value of an N-bit charge pump control signal 58.

An example implementation of the variable magnitude charge pump circuit 56 comprises N fixed magnitude charge pump circuits 20(1)-20(N), similar for example to the circuit used in FIG. 1, coupled in parallel to generate the charge pump output current Icp(t). Each fixed magnitude charge pump circuit 20 comprises a current source (path) circuit 20a that operates in response to assertion of the up signal U(t) to provide a sourcing current contribution and a current sink (path) circuit 20b that operates in response to assertion of the down signal D(t) to provide a sinking current contribution. The fixed magnitude charge pump circuits 20(1)-20(N) are individually enabled for operation in response to a corresponding bit of the N-bit charge pump control signal 58. The overall circuit 56 is enabled in response to a control signal 68. With each fixed magnitude charge pump circuit 20 generating a same magnitude current pulse, the variable magnitude of the current pulse for the charge pump output current Icp(t) is thus equal to the fixed magnitude times the number of bits of the N-bit charge pump control signal 58 that are asserted (for example, logic high).

The PLL circuit 50 further differs from the PLL circuit 10 in the addition of a calibration circuit 54 that operates to generate the N-bit charge pump control signal 58 for setting the variable magnitude of the current pulses output by the variable magnitude charge pump circuit 56. The calibration circuit 54 is programmed with knowledge of the gain KVCO of the VCO circuit 30 over a range of output frequencies for the oscillating output signal Vout(t). Using this knowledge, along with a specification of the frequency relationship between the reference clock signal CLKref(t) and the oscillating output signal Vout(t) as set by the overall loop divisor of the PLL circuit, the calibration circuit 54 functions to select a digital value for the N-bit charge pump control signal 58 to generate the current pulses 23a and 23b with a variable magnitude so that the product of the charge pump current Icp(t) and the gain KVCO is equal to a certain (nominal) constant value.

The calibration circuit 54 includes a variable voltage generator circuit 60 configured to generate an output voltage Vswp that is controlled in response to a voltage control signal 62. In an embodiment, the voltage control signal 62 is a P-bit digital signal where the digital value of the voltage control signal 62 sets an instantaneous magnitude of the output voltage Vswp.

The calibration circuit 54 further includes a loop switch (SW) 66 that is selectively controlled by the control signal 68. The switch 66 has a first input coupled to receive the charge pump current Icp(t) and a second input coupled to receive the output voltage Vswp. When the switch 66 is controlled in a first connection state by the control signal 68, the loop of the PLL circuit 50 is closed (with the charge pump circuit 56 enabled for operation) and the output charge pump current Icp(t) is applied to the loop filter 22. This conforms to a normal operating mode for the PLL circuit 50 where the control voltage Vctrl(t) for the VCO circuit 30 is driven in response to the charge pump current Icp(t). Conversely, when the switch 66 is controlled in a second connection state by the control signal 68, the loop of the PLL circuit 50 is opened (with the charge pump circuit 56 disabled for operation) and the output voltage Vswp is applied to the loop filter 22. This conforms to a calibration operating mode for the PLL circuit 50 where the control voltage Vctrl(t) for the VCO circuit 30 is driven in response to the output voltage Vswp.

The calibration circuit 54 still further includes a frequency measurement circuit 72 that is coupled to receive the (divided and level shifted, if desired or necessary) oscillating output signal Vout(t). The frequency measurement circuit 72 operates to generate an M-bit digital signal 74 indicative of a measured frequency (f_meas) of the oscillating output signal Vout(t). In an example implementation, the frequency measurement circuit 72 comprises a counter circuit that operates to count a number of cycles of the (divided and level shifted, if desired or necessary) oscillating output signal Vout(t) which occur within a certain number of cycles of the reference clock signal CLKref(t). The determined count value is output as the M-bit digital signal 74 indicative of the measured frequency. In this implementation, the measured frequency can be calculated from:

$$f\_meas = \frac{count * DIV * fref}{cycle\#}$$

wherein: count is the count value generated by the counter circuit; DIV is the fixed divider value (if any) used by the fixed divider and level shifting circuit 32, fref is the frequency of the reference clock signal CLKref(t), and cycle# is the certain number of cycles of the reference clock signal CLKref(t) over which the counting is performed. It will, of course, be understood that circuits other than a counter circuit could be used as a suitable frequency measurement circuit.

A digital processing circuit, for example implemented as a state machine circuit 80, receives the M-bit digital signal 74, the reference clock signal CLKref(t) and the integer component INTdiv and fractional component FRACdiv which set the programmable division ratio of the programmable divider circuit 34. The digital processing circuit 80 generates the N-bit charge pump control signal 58, the P-bit voltage control signal 62 and the switch control signal 68.

Figure 4:
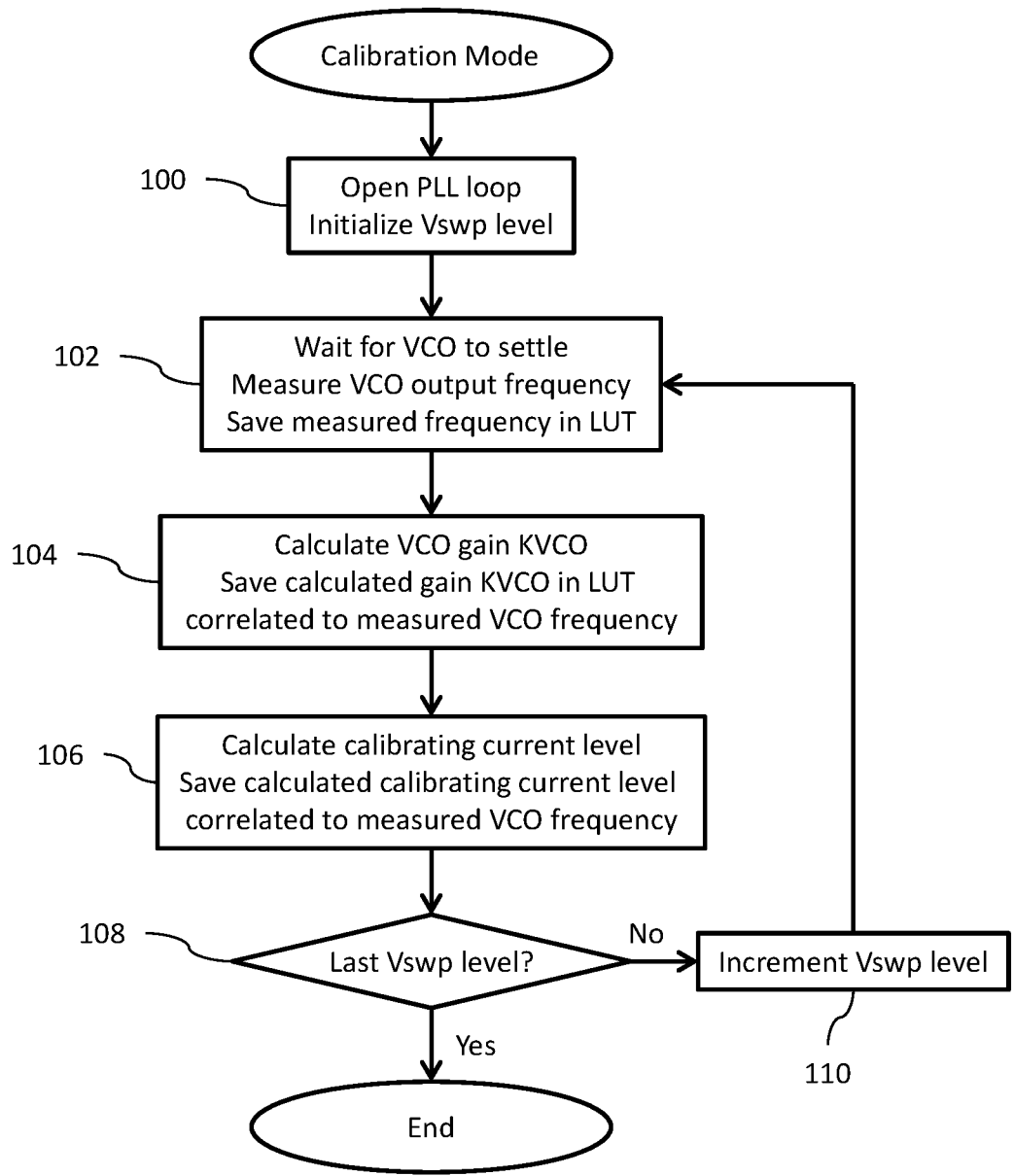
FIG. 4 is a flow diagram of a calibrating operation mode for the PLL circuit of FIG. 3.

FIG. 4 shows a flow diagram for the calibration mode of operation. Operation of the digital processing circuit 80 in connection with implementation of the calibration operating mode for the PLL circuit 50 is as follows: The switch control signal 68 controls the switch 66 into the second connection state where the loop of the PLL circuit 50 is opened (step 100). In this case, the charge pump circuit 56 is also disabled from operation by the switch control signal 68. The P-bit voltage control signal 62 sets the magnitude of the output voltage Vswp that is generated by the variable voltage generator circuit 60 and applied through switch 66 to the loop filter 22. An initial value for the Vswp level is set in step 100, and is subsequently incremented in step 110. After a wait delay to account for operation of the loop filter 22 (step 102) and allow for settling, the control voltage Vctrl(t) for the VCO circuit 30 will equal the output voltage Vswp and the frequency of the oscillating output signal Vout(t) is thus controlled by the output voltage Vswp. The frequency measurement circuit 72 measures the oscillating output signal Vout(t) and generates the M-bit digital signal 74 indicative of the measured frequency (step 102). Calculation of the measured frequency f_meas may be made by the digital processing circuit 80 or provided directly by the frequency measurement circuit 72. The measured frequency is then recorded in a memory of the digital processing circuit 80 using a look-up table (LUT) 82 (see, FIG. 6).

The digital processing circuit 80 can control the generation of values for the P-bit voltage control signal 62 so as to cause the variable voltage generator circuit 60 to sweep the output voltage Vswp, and hence the control voltage Vctrl(t) for the VCO circuit 30, over a desired voltage range (for example, from a minimum control voltage level to a maximum control voltage level of the VCO circuit 30). This sweeping of the control voltage Vctrl(t) can be performed in plural discrete steps (identified by the index i from 1 to n) with a constant voltage step size ($\Delta V$) between consecutive steps. This is accomplished by testing in step 108 whether a last increment of the Vswp level has been reached, and if not then incrementing the Vswp level in step 110 by that constant voltage step size before returning to step 102. The measurement of the oscillating output signal Vout(t) is made in step 102 for each step in the sweeping of the control voltage Vctrl(t), and the measured frequency is calculated and saved in the look-up table 82 at each index i step of the Vswp level.

The gain KVCO of the VCO circuit 30 for each step of the control voltage Vctrl(t) is then calculated by the digital processing circuit 80 in step 104 from two consecutive measured frequencies for the oscillating output signal Vout(t) as a function of a difference in voltage levels (i.e., the constant voltage step size $\Delta V$) for the output voltage Vswp from which those measured frequencies for the oscillating output signal Vout(t) were generated. Specifically, the gain KVCO for the i+1-th step is given by:

$$KVCO_{i+1} = \frac{(f\_meas_{i+1} - f\_meas_i)}{\Delta V}$$

wherein: $f\_meas_{i+1}$ is the measured frequency at the i+1-th step; $f\_meas_i$ is the measured frequency at the i-th step, and $\Delta V$ is the difference in the magnitude of the output voltages ($Vswp_{i+1} - Vswp_i$) for those two frequencies. The calculated gain KVCO value is stored in the look-up table 82 correlated to the measured frequency $f\_meas_{i+1}$ at the i+1-th step (step 104). At a completion of the calibration mode of operation, the look-up table 82 will store a calculated VCO gain KVCO correlated to each discrete measured frequency step for the oscillating output signal Vout(t).

A calculated calibrated magnitude ical for the variable magnitude vM of the charge pump pulses 23a and 23b generated by the charge pump circuit 56 of the PLL circuit 50 is then determined by the digital processing circuit 80 in step 106 from the relationship:

$$ical_i = \frac{ICP\_KVCO\_Product}{KVCO_i}$$

wherein: ICP_KVCO_Product is the desired product of the nominal charge pump current and gain KVCO to be kept constant (i.e., this is the certain constant value, as referred to above, which is the nominal product to be maintained for PLL circuit operation regardless of operation frequency), and KVCO, is the calculated VCO gain KVCO in the look-up table 82 for the corresponding measured frequency $f\_meas_i$ at the i-th step. This calculated calibrated magnitude $ical_i$ for the variable magnitude vM of the charge pump current pulses is then stored by the digital processing circuit 80 in the look-up table 82 correlated to the measured frequency fi at the i-th step (step 106).

Figure 6:
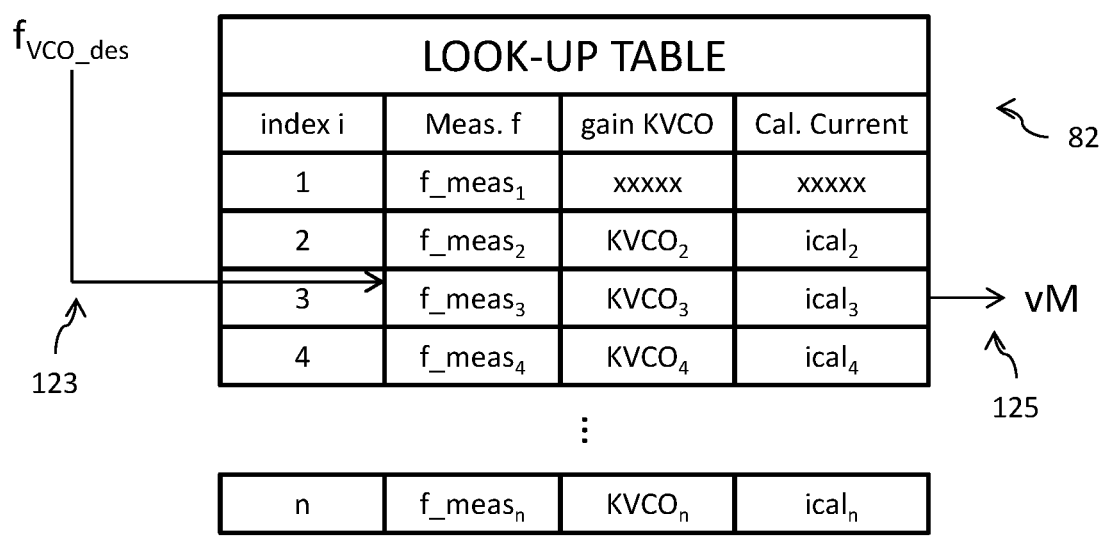
FIG. 6 shows an example of a look-up table and its use in calibrating the PLL circuit.

It will be noted, with reference to FIG. 6, that for i=1 there is no calculation of the gain KVCO or the calculated magnitude ical for the variable magnitude vM because these values depend on having access to two measured frequencies. If desired, the values for i=1 may be extrapolated from the other calculated values.

A determination is then made in step 108 as to whether the last Vswp level has been reached. If no, the Vswp level is incremented in step 110 and the process returns to step 102. If yes, the calibration mode of operation ends and the look-up table 82 is fully populated.

Figure 5:
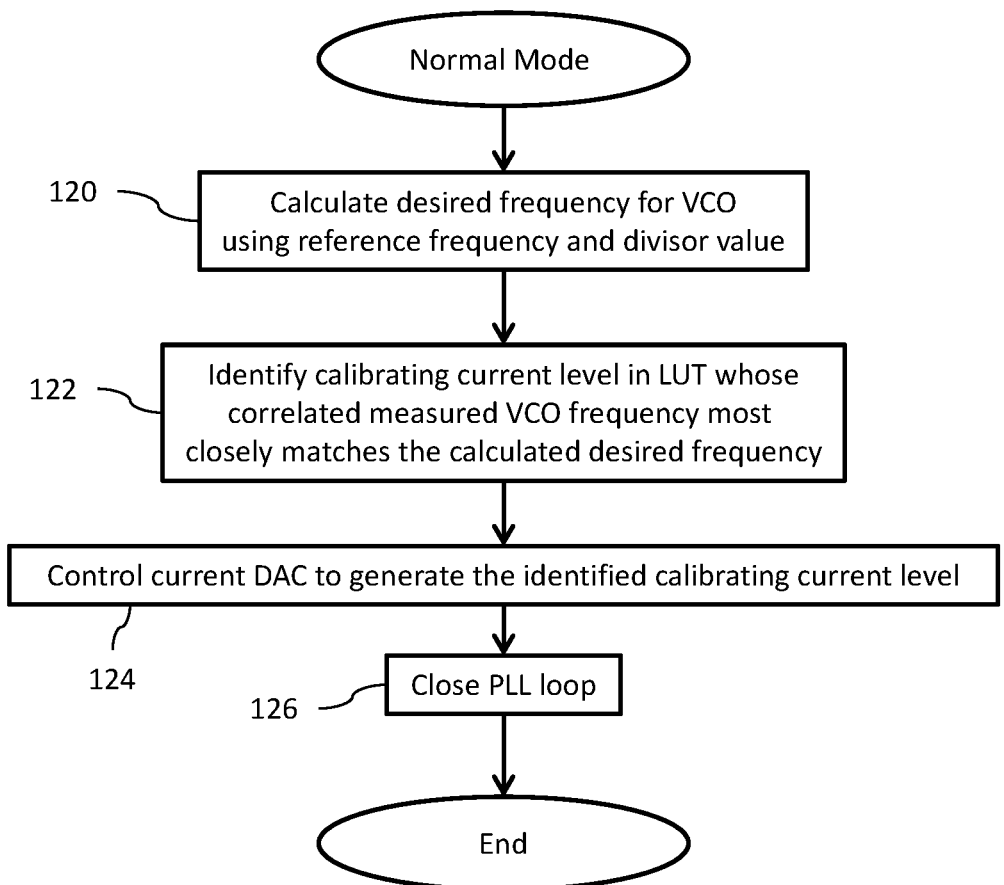
FIG. 5 is a flow diagram of a normal operation mode for the PLL circuit of FIG. 3.

FIG. 5 shows a flow diagram for the normal mode of operation of the PLL circuit 50. Operation of the digital processing circuit 80 in connection with implementation of the normal operating mode for the PLL circuit 50 is as follows: From the frequency of the input reference clock signal CLKref(t), the input integer component INTdiv and the input fractional component FRACdiv, and with knowledge of the fixed divisor (if any) implemented by the fixed divider and level shifting circuit 32, the digital processing circuit 80 can calculate in step 120 a desired frequency $f_{VCO\_des}$ for the oscillating output signal Vout(t) in accordance with:

$$f_{VCO\_des} = f_{ref} * (\text{integer\#} + \text{fractional\#})$$

wherein: $f_{ref}$ is the frequency of the reference clock signal CLKref(t), integer# is the overall integer divisor value (equal here to INTdiv plus the fixed divisor of the circuit 32), and fractional# is the overall fractional divisor value (equal here to FRACdiv). The desired frequency $f_{VCO\_des}$ is then compared to the measured frequencies $f\_meas_i$ of the oscillating output signal Vout(t) saved in the look-up table 82 (FIG. 6, reference 123 for an example where $f_{VCO\_des}$ is determined to be closest to $f\_meas_3$). This comparison operation functions to identify in step 122 the calculated calibrated magnitude $ical_i$ for the variable magnitude vM whose corresponding measured frequency fi of the oscillating output signal Vout(t) in the LUT 82 most closely matches the desired frequency $f_{VCO\_des}$. The digital processing circuit 80 then generates the digital value for the N-bit charge pump control signal 58 in step 124 which will cause the current digital-to-analog (D/A) converter circuit provided by the charge pump 56 to generate the pulses 23a and 23b for the charge pump current Icp(t) that have a magnitude vM that substantially matches the identified calculated calibrated magnitude ical$_i$ (see FIG. 6, reference 125 for the example where control signal 58 sets circuit 56 to generate a pulses for the charge pump current having a magnitude ical$_3$). The digital processing circuit 80 then generates the switch control signal 68 in step 126 to control the switch 66 into the first connection state where the loop of the PLL circuit 50 is closed.

An advantage of the calibration scheme disclosed herein is that the scheme is independent of the architecture used for the VCO circuit 30. Additionally, because the gain KVCO is actually measured on chip by the calibration circuit 54 to calculate the magnitude ical of the variable magnitude vM charge pump current pulses, the scheme is more robust. Still further, the scheme does not inject any significant error into loop of the PLL circuit. Indeed, injected error is limited because: a) any analog amplifier gain error can be reduced by increasing amplifier gain (there is no tight constraint on amplifier bandwidth); b) the calculations of f_meas, KVCO and ical are based on a digital counter measurement which exhibits predictable and controlled error; and c) the use of a LUT 82 correlating f_meas and ical has the advantage of removing any frequency-to-voltage and/or voltage-to-frequency conversion errors since the desired frequency $f_{VCO\_des}$ is being directly compared to the measured frequency f_meas in the LUT.

In summary, in order to meet tight inter-related PLL specifications of area, power and jitter, it is necessary to control the PLL bandwidth and contain its spread. The calibration scheme described above can be used to achieve this goal. The PLL loop is opened and then calibrated to keep the product of charge pump current Icp and gain KVCO constant. The calibration scheme measures the gain KVCO by sweeping the VCO control voltage over a range of values, measuring VCO output frequency at each control voltage level, and calculating a charge pump current pulse magnitude ical such that the product Icp*KVCO is constant at a predefined (nominal) value. A look-up table correlates each measured frequency to a corresponding calculated charge pump current magnitude ical. Once calibration is completed, the PLL loop is closed and a calculated charge pump current magnitude ical is fetched from the look-up table based on a desired output frequency $f_{VCO\_des}$ for the PLL circuit. The variable magnitude vM of the current pulses generated by the charge pump circuit for the PLL circuit is then controlled to substantially equal the fetched charge pump current magnitude ical.

It will be noted that the proper configuration of the PLL circuit is automatic in response to a change in the desired VCO output frequency. The frequency change will be implemented by the user through modification of the input integer component INTdiv and/or the input fractional component FRACdiv. The digital processing circuit 80 will respond to the change by calculating a new desired frequency $f_{VCO\_des}$, finding the closed measured frequency f_meas in the LUT 82, and fetching the corresponding calculated charge pump current magnitude ical in order to generate the N-bit charge pump control signal 58 for controlling the variable magnitude vM of the charge pump output current pulses.

With respect to concerns with change in temperature, the digital processing circuit 80 can switch back into the calibration mode of operation (FIG. 4) and generate an updated LUT 82 which accounts for VCO operation at the current temperature level. The trigger to start a new calibration mode of operation can be made in response to significant change in temperature as sensed by a temperature sensor 84 coupled to the digital processing circuit 80. Alternatively, the calibration process can be performed in advance at multiple temperatures to produce a separate LUT 82 at each temperature level. The digital processing circuit 80 can then select one of the LUTs for use in response to the temperature sensed by a temperature sensor 84.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit for calibrating a variable magnitude charge pump current of a charge pump circuit in a phase lock loop (PLL) circuit that includes a voltage controlled oscillator (VCO) circuit, comprising:
   a voltage generator circuit configured, with the PLL circuit in open loop, to apply a sweeping control voltage to the VCO circuit in a plurality of discrete steps with a voltage difference between steps;
   a frequency measurement circuit configured to measure a frequency of a signal output from the VCO circuit at each discrete step; and
   a processing circuit configured to:
      determine a gain of the VCO circuit for each measured frequency as a function of a difference in measured frequency between discrete steps divided by said voltage difference between discrete steps;
      calculate a calibrated magnitude for the variable magnitude charge pump current correlated to each measured frequency as a function of a constant divided by the determined gain for that measured frequency;
      identify one of the measured frequencies which is closest to a desired frequency of the signal output from the VCO circuit; and
      control the variable magnitude charge pump circuit in the PLL circuit to generate the charge pump current with a magnitude equal to the calibrated magnitude for the nominal charge pump current that is correlated to the identified one of the measured frequencies.

2. The circuit of claim 1, further comprising a loop switch controlled by the processing circuit to place the PLL circuit in open loop during a calibration mode of operation where the gain of the VCO circuit is determined and the calibrated magnitude for the variable magnitude charge pump current is calculated.

3. The circuit of claim 2, wherein the processing circuit further disables the variable magnitude charge pump circuit when in the calibration mode of operation.

4. The circuit of claim 2, wherein the loop switch is further controlled by the processing circuit to place the PLL circuit in closed loop during a normal mode of operation where the charge pump current of the variable magnitude charge pump circuit is generated with the magnitude equal to said calibrated magnitude.

5. The circuit of claim 4, wherein the processing circuit further enables the variable magnitude charge pump circuit when in the normal mode of operation.

6. The circuit of claim 1, wherein the processing circuit is a state machine circuit.

7. The circuit of claim 1, wherein the frequency measurement circuit comprises a counter circuit configured to count a number of cycles of the signal output from the VCO circuit within a fixed time period, with the counted number of cycles being indicative of the measured frequency.

8. The circuit of claim 7, wherein the fixed time period is set by a certain number of cycles of a reference clock for the PLL circuit.

9. The circuit of claim 1, wherein the processing circuit is configured to control the voltage generator circuit to generate the sweeping control voltage.

10. The circuit of claim 1, wherein the variable magnitude charge pump circuit comprises:
a plurality of current circuits connected in parallel, wherein each current circuit comprises:
a first current source configured to source a first current to an output of the charge pump circuit in response to a first phase difference detected by the PLL circuit; and
a second current source configured to sink a second current from the output of the charge pump circuit in response to the second phase difference detected by the PLL circuit;
wherein a number of the current circuits enabled for operation sets the magnitude of the variable magnitude charge pump circuit equal to the calibrated magnitude that is correlated to the identified one of the measured frequencies.

11. The circuit of claim 1, wherein the voltage difference between discrete steps is constant with respect to all discrete steps of the sweeping control voltage.

12. A phase lock loop (PLL) circuit, comprising:
a phase-frequency detector configured to compare a reference signal to a feedback signal and generate an up control signal and down control signal in response to the comparison;
a variable magnitude charge pump circuit configured to generate a charge pump output current in response to the up control signal and the down control signal, said charge pump output current have a magnitude set in response to a digital control signal;
a loop filter configured to receive the charge pump output current and generate a control voltage;
a voltage controlled oscillator (VCO) circuit configured to generate an oscillator output signal in response to the control voltage;
a loop divider circuit configured to generate the feedback signal from the oscillator output signal with a frequency division set by a divisor control signal; and
a processing circuit including a look-up table that correlates a plurality of measured frequencies for the oscillator output signal to a corresponding plurality of calibrated magnitudes for the charge pump output current, wherein the processing circuit:
responds to the divisor control signal to determine a desired frequency of the signal output from the VCO circuit;
identify one of the measured frequencies in the look-up table which is closest to the desired frequency; and
generate the digital control signal to set the magnitude of the charge pump output current to equal the calibrated magnitude that is correlated to the identified one of the measured frequencies.

13. The circuit of claim 12, wherein the variable magnitude charge pump circuit comprises:
a plurality of current circuits connected in parallel, wherein each current circuit comprises:
a first current source configured to source a first current to an output of the charge pump circuit in response to a first phase difference detected by the PLL circuit; and
a second current source configured to sink a second current from the output of the charge pump circuit in response to the second phase difference detected by the PLL circuit;
wherein a number of the current circuits enabled for operation sets the magnitude of the charge pump output current equal to the calibrated magnitude that is correlated to the identified one of the measured frequencies.

14. The circuit of claim 12, further comprising a calibration circuit configured to generate the look-up table during a calibration mode of operation.

15. The circuit of claim 14, wherein the calibration circuit comprises:
a voltage generator circuit configured, with the PLL circuit in open loop, to apply a sweeping control voltage to the VCO circuit in a plurality of discrete steps with a voltage difference between steps; and
a frequency measurement circuit configured to measure a frequency of a signal output from the VCO circuit at each discrete step for entry in the look-up table as one of the measured frequencies.

16. The circuit of claim 15, wherein the processing circuit is configured to control the voltage generator circuit to generate the sweeping control voltage.

17. The circuit of claim 15, wherein the processing circuit is configured to:
determine a gain of the VCO circuit for each measured frequency as a function of a difference in measured frequency between discrete steps divided by said voltage difference between discrete steps; and
calculate the calibrated magnitude for the charge pump output current correlated to each measured frequency as a function of a constant divided by the determined gain for that measured frequency.

18. The circuit of claim 14, further comprising a loop switch controlled by the processing circuit to place the PLL circuit in open loop during said calibration mode of operation.

19. The circuit of claim 18, wherein the processing circuit further disables the variable magnitude charge pump circuit when in the calibration mode of operation.

20. The circuit of claim 18, wherein the loop switch is further controlled by the processing circuit to place the PLL circuit in closed loop during a normal mode of operation where the charge pump output current of the variable magnitude charge pump circuit is generated with the magnitude equal to said calibrated magnitude.

21. The circuit of claim 20, wherein the processing circuit further enables the variable magnitude charge pump circuit when in the normal mode of operation.

22. A method for calibrating a charge pump current of a variable magnitude charge pump circuit in a phase lock loop (PLL) circuit that includes a voltage controlled oscillator (VCO) circuit, comprising:
placing the PLL circuit in open loop, and while in open loop:
applying a sweeping control voltage to the VCO circuit in a plurality of discrete steps with a voltage difference between steps;

measuring a frequency of a signal output from the VCO circuit at each discrete step;

determining a gain of the VCO circuit for each measured frequency as a function of a difference in measured frequency between discrete steps divided by said voltage difference between discrete steps; and calculating a calibrated magnitude for the charge pump current correlated to each measured frequency as a function of a constant divided by the determined gain for that measured frequency;

identifying one of the measured frequencies which is closest to a desired frequency of the signal output from the VCO circuit;

controlling the variable magnitude charge pump circuit in the PLL circuit to generate the charge pump current with a magnitude equal to the calibrated magnitude that is correlated to the identified one of the measured frequencies; and then placing the PLL circuit in closed loop.

23. The method of claim 22, further comprising disabling the variable charge pump circuit while in open loop.

24. The method of claim 22, further comprising enabling the variable charge pump circuit while in closed loop.

25. The method of claim 22, measuring frequency comprises counting a number of cycles of the signal output from the VCO circuit within a fixed period, with the counted number of cycles being indicative of the measured frequency.

26. The method of claim 25, wherein the fixed period is set by a certain number of cycles of a reference clock for the PLL circuit.

27. The method of claim 22, wherein the voltage difference between discrete steps is constant with respect to all discrete steps of the sweeping control voltage.

* * * * *